United States Patent
Jao et al.

(10) Patent No.: US 9,432,560 B2
(45) Date of Patent: Aug. 30, 2016

(54) IMAGE CAPTURING MODULE FOR SAVING FOCUSING TIME AND INCREASING ASSEMBLY FLATNESS AND METHOD OF ASSEMBLING THE SAME

(71) Applicant: LARVIEW TECHNOLOGIES CORP., Taoyuan County (TW)

(72) Inventors: Ching-Lung Jao, Taipei (TW); Chiang-Yuan Chuang, Taipei (TW); Yu-Te Chou, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

(*) Notice: Subject to any disclaimer, the term of this patent is extended or adjusted under 35 U.S.C. 154(b) by 5 days.

(21) Appl. No.: 14/452,635

(22) Filed: Aug. 6, 2014

(65) Prior Publication Data

US 2016/0044213 A1    Feb. 11, 2016

(51) Int. Cl.
| | |
|---|---|
| H04N 3/14 | (2006.01) |
| H04N 5/225 | (2006.01) |
| G03B 13/36 | (2006.01) |
| H05K 3/32 | (2006.01) |

(52) U.S. Cl.
CPC .......... *H04N 5/2252* (2013.01); *G03B 13/36* (2013.01); *H04N 5/2254* (2013.01); *H05K 3/32* (2013.01)

(58) Field of Classification Search
CPC ...... H04N 5/335; H04N 5/378; H04N 3/155; H04N 9/045; H04N 5/2251; H04N 5/2252; H04N 5/2253; H04N 5/2254; H01L 27/14643; G08B 13/19619

USPC .................................................. 348/373–375
See application file for complete search history.

(56) References Cited

U.S. PATENT DOCUMENTS

| | | | | |
|---|---|---|---|---|
| 8,421,911 B2* | 4/2013 | Tsai | ................. | H01L 27/14618 250/208.1 |
| 2012/0068292 A1* | 3/2012 | Ikeda | .................. | G02B 13/006 257/432 |
| 2013/0258187 A1* | 10/2013 | Park et al. | ........... | H04N 5/2254 348/374 |
| 2015/0009400 A1* | 1/2015 | Shin | ..................... | H04N 5/2254 348/373 |

* cited by examiner

*Primary Examiner* — Sinh Tran
*Assistant Examiner* — Selam T Gebriel
(74) *Attorney, Agent, or Firm* — Li & Cai Intellectual Property (USA) Office

(57) ABSTRACT

An image capturing module for saving focusing time and increasing assembly flatness and a method of assembling the same are disclosed. The image sensing chip has a first horizontal top surface, the optical filter has a second horizontal top surface, and the first horizontal top surface and second horizontal top surface are obtained by a horizontal correction system using a laser light source. The distance from the second horizontal top surface to the first horizontal top surface is defined as a predetermined fixed focusing distance. Whereby, the movable lens assembly is directly disposed on the second horizontal top surface to save the focusing time of the movable lens assembly relative to the image sensing chip, and the first horizontal top surface and the second horizontal top surface are horizontal to each other for increasing the assembly flatness of the movable lens assembly relative to the image sensing chip.

10 Claims, 4 Drawing Sheets

IMAGE CAPTURING MODULE FOR SAVING FOCUSING TIME AND INCREASING ASSEMBLY FLATNESS AND METHOD OF ASSEMBLING THE SAME

BACKGROUND OF THE INVENTION

1. Field of the Invention

The instant disclosure relates to an image capturing module and a method of assembling the same, and more particularly to an image capturing module for saving focusing time and increasing assembly flatness and a method of assembling the same.

2. Description of Related Art

Recently, it has become more and more popular for portable devices such as mobile phones or PDA to be equipped with an imaging module. Furthermore, since the market requires these portable devices to have more powerful functions and smaller sizes, it is necessary for the imaging module to generate high quality pictures and to be of small size. One improvement of picture quality is to increase the number of pixels. The pixel number of an imaging module has already increased from the VGA-level 30 pixels to 2, 3 or even 8 million pixels, which is now common in the market. Another improvement lies in the definition of the image. Thus, the imaging module of a portable device also develops from a fixed-focus mode to auto-focus mode or even optical zoom mode.

The auto-focus mode employs the principle of moving the lens in the imaging module suitably according to various distances of targets, whereby the optical image of the desired target is focused correctly on an image sensor to generate a clear image. The common ways of activating the lens to move in the imaging module include activating by a stepping motor, piezoelectric motor and voice coil motor (VCM). However, when both the image sensor and the sensor housing are disposed on the same stacked datum plane of the circuit board, the assembly tilt angle of the sensor housing relative to the image sensor would be increased, thus the image quality provided by the imaging module cannot be improved due to the increased assembly tilt angle. Besides, it is very time consuming to manually focus the imaging module relative to the image sensor.

SUMMARY OF THE INVENTION

One aspect of the instant disclosure relates to an image capturing module for saving focusing time and increasing assembly flatness and a method of assembling the same.

One of the embodiments of the instant disclosure provides an image capturing module for saving focusing time and increasing assembly flatness, comprising: an image sensing unit, a housing frame, an actuator structure and an optical filter. The image sensing unit includes a carrier substrate and an image sensing chip disposed on the carrier substrate and electrically connected to the carrier substrate, wherein the image sensing chip has a first horizontal top surface on the top side thereof, and the first horizontal top surface is obtained by a horizontal correction system using a laser light source. The housing frame is disposed on the carrier substrate to surround the image sensing chip. The actuator structure is disposed on the housing frame and above the image sensing chip, wherein the actuator structure includes a lens holder disposed on the housing frame and a movable lens assembly disposed inside the lens holder and above the image sensing chip, the lens holder includes a surrounding movable member movably disposed therein, the movable lens assembly is fixed inside the surrounding movable member through at least two separate bonding glue, and the movable lens assembly is movably disposed inside the lens holder through the surrounding movable member. The optical filter is disposed on the housing frame and between the image sensing chip and the movable lens assembly, wherein the optical filter has a second horizontal top surface on the top side thereof, and the second horizontal top surface is obtained by the horizontal correction system using the laser light source, and the distance from the second horizontal top surface of the optical filter to the first horizontal top surface of the image sensing chip is defined as a predetermined fixed focusing distance. Whereby, the movable lens assembly is directly disposed on the second horizontal top surface of the optical filter to save the focusing time of the movable lens assembly relative to the image sensing chip, and the first horizontal top surface of the image sensing chip and the second horizontal top surface of the optical filter are horizontal to each other for increasing the assembly flatness of the movable lens assembly relative to the image sensing chip.

Another one of the embodiments of the instant disclosure provides an image capturing module for saving focusing time and increasing assembly flatness, comprising: an image sensing unit, a housing frame, an actuator structure and an optical filter. The image sensing unit includes a carrier substrate and an image sensing chip disposed on the carrier substrate and electrically connected to the carrier substrate, wherein the image sensing chip has a first horizontal top surface on the top side thereof. The housing frame is disposed on the carrier substrate to surround the image sensing chip. The actuator structure is disposed on the housing frame and above the image sensing chip, wherein the actuator structure includes a lens holder disposed on the housing frame and a movable lens assembly movably disposed inside the lens holder and above the image sensing chip. The optical filter is disposed on the housing frame and between the image sensing chip and the movable lens assembly, wherein the optical filter has a second horizontal top surface on the top side thereof, and the distance from the second horizontal top surface of the optical filter to the first horizontal top surface of the image sensing chip is defined as a predetermined fixed focusing distance. Whereby, the movable lens assembly is directly disposed on the second horizontal top surface of the optical filter to save the focusing time of the movable lens assembly relative to the image sensing chip, and the first horizontal top surface of the image sensing chip and the second horizontal top surface of the optical filter are horizontal to each other for increasing the assembly flatness of the movable lens assembly relative to the image sensing chip.

Yet another one of the embodiments of the instant disclosure provides a method of assembling an image capturing module for saving focusing time and increasing assembly flatness, comprising: providing an image sensing unit and a housing frame, wherein the image sensing unit includes a carrier substrate and an image sensing chip disposed on the carrier substrate and electrically connected to the carrier substrate, and the housing frame is disposed on the carrier substrate to surround the image sensing chip; obtaining a first horizontal top surface on the top side of the image sensing chip by a horizontal correction system using a laser light source; placing an optical filter on the housing frame and above the image sensing chip; obtaining a second horizontal top surface on the top side of the optical filter by the horizontal correction system using the laser light source, wherein the distance from the second horizontal top surface of the optical filter to the first horizontal top surface of the image sensing chip is defined as a predetermined fixed focusing distance; providing an actuator structure disposed on the housing frame and above the image sensing chip, wherein the actuator structure includes a lens holder disposed on the housing frame and a movable lens assembly disposed inside the lens holder and above the image sensing chip, and the lens holder includes a surrounding movable member movably disposed therein, wherein the movable lens assembly is directly disposed on the second horizontal top surface of the optical filter to save the focusing time of the movable lens assembly relative to the image sensing chip, and the first horizontal top surface of the image sensing chip and the second horizontal top surface of the optical filter are horizontal to each other for increasing the assembly flatness of the movable lens assembly relative to the image sensing chip; and then fixing the movable lens assembly inside the surrounding movable member through at least two separate bonding glue, wherein the movable lens assembly is movably disposed inside the lens holder through the surrounding movable member.

Therefore, the first horizontal top surface on the top side of the image sensing chip and the second horizontal top surface on the top side of the optical filter can be obtained by the horizontal correction system using the same laser light source, thus when the second horizontal top surface of the optical filter is horizontal to the first horizontal top surface of the image sensing chip, the assembly tilt angle of the movable lens assembly relative to the image sensing chip can be reduced for ensuring the flatness of the movable lens assembly relative to the image sensing chip. More precisely, when the distance from the second horizontal top surface of the optical filter to the first horizontal top surface of the image sensing chip is defined as a predetermined fixed focusing distance in advance, the movable lens assembly can be directly disposed on the second horizontal top surface of the optical filter to cut down the focusing time of the movable lens assembly relative to the image sensing chip.

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "an image capturing module for saving focusing time and increasing assembly flatness and a method of assembling the same" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Figure 1:
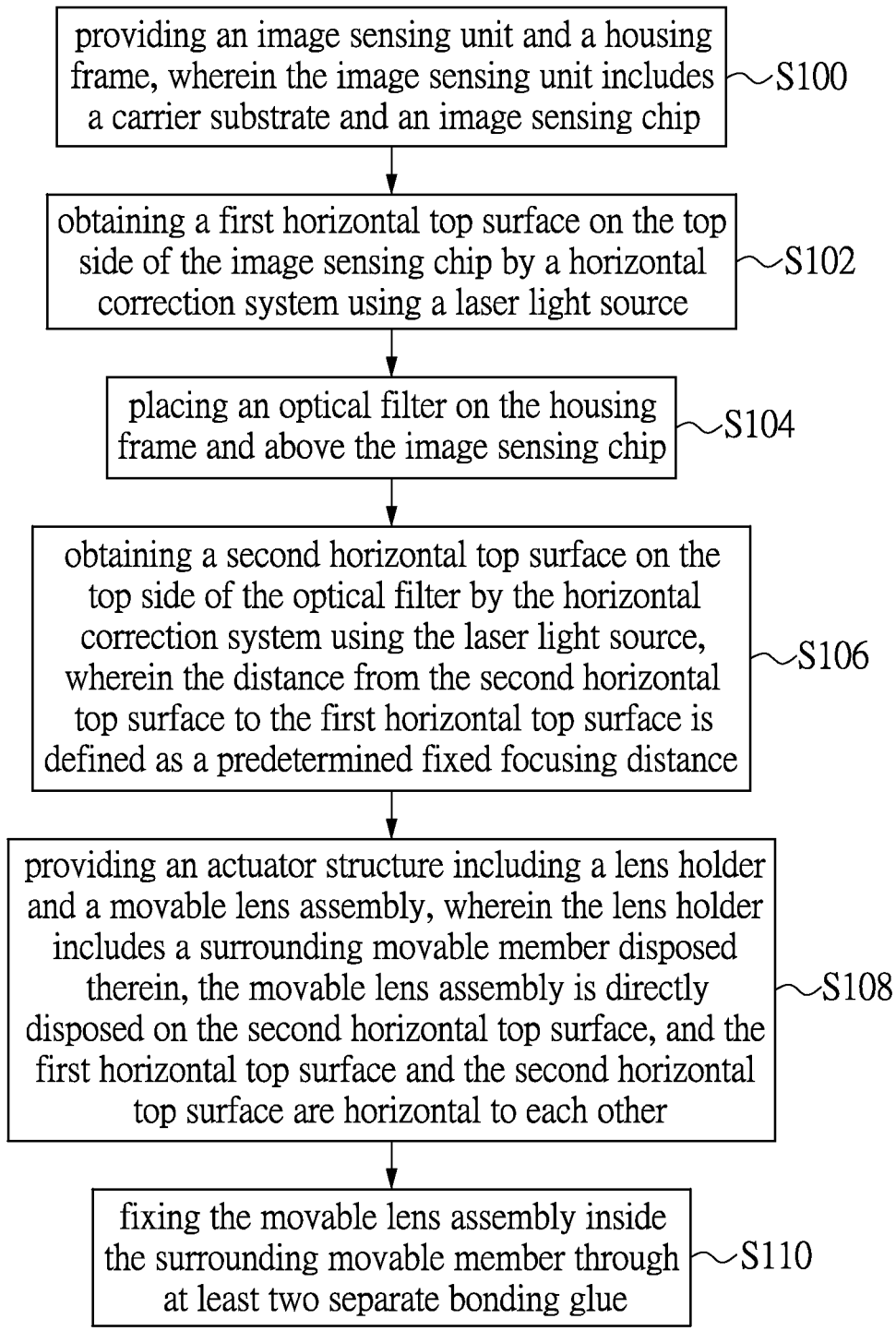
FIG. 1 shows a flowchart of the method of assembling an image capturing module for saving focusing time and increasing assembly flatness according to the instant disclosure.
Figure 2:
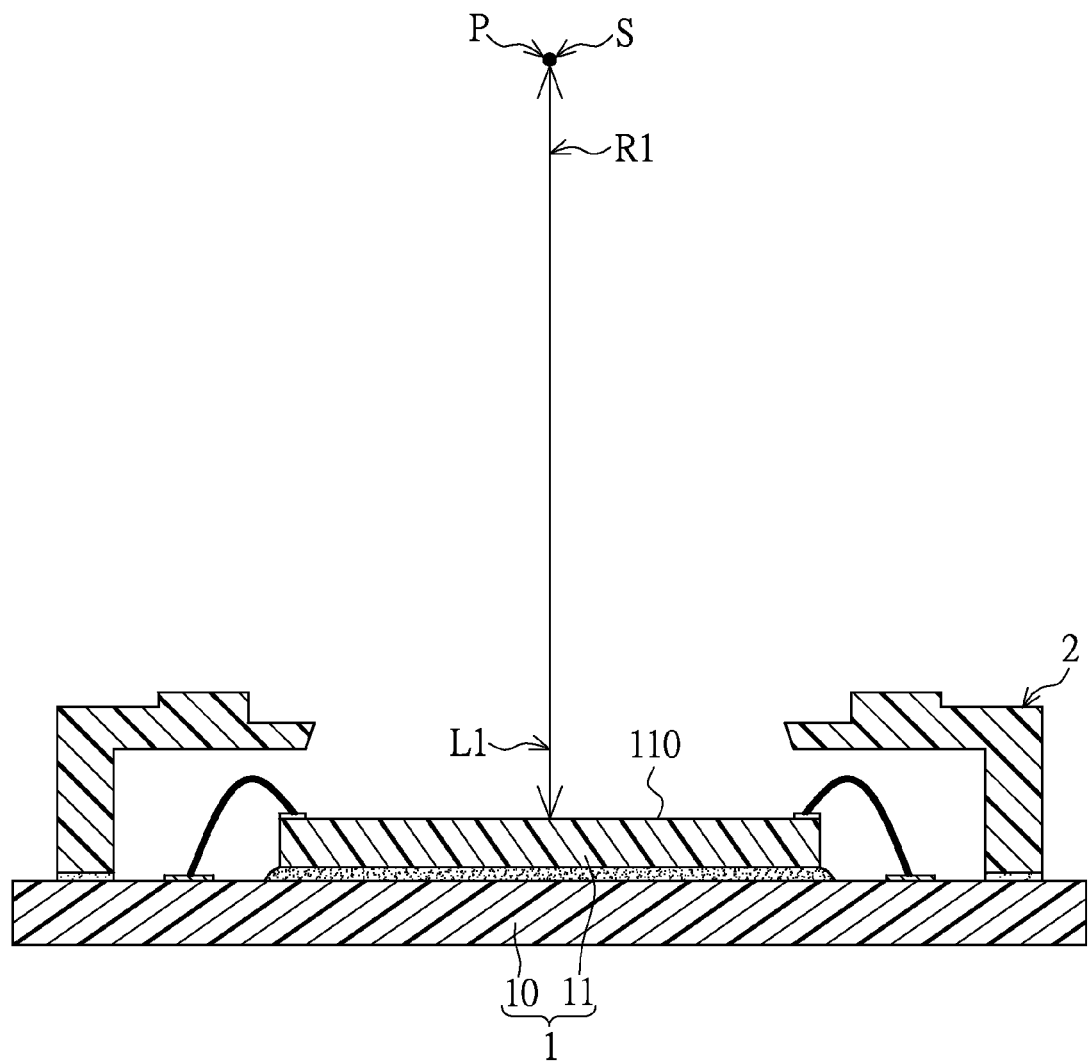
FIG. 2 shows a lateral, cross-sectional, schematic view of the assembly steps S100 and S102 of the method of assembling an image capturing module for saving focusing time and increasing assembly flatness according to the instant disclosure.

Referring to FIG. 1 to FIG. 4, the instant disclosure provides a method of assembling an image capturing module M for saving focusing time and increasing assembly flatness, comprising the following steps:

First, the step S100 is that: referring to FIG. 1 and FIG. 2, providing an image sensing unit 1 and a housing frame 2, wherein the image sensing unit 1 includes a carrier substrate 10 (or a carrying substrate) and an image sensing chip 11 disposed on the carrier substrate 10 and electrically connected to the carrier substrate 10, and the housing frame 2 is disposed on the carrier substrate 10 to surround the image sensing chip 11. For example, the image sensing chip 11 may be a CMOS (Complementary Metal-Oxide-Semiconductor) sensor, and the image sensing chip 11 can be adhesively disposed on the carrier substrate 10 through any type of adhesive material (not labeled) such as UV adhesive glue, thermosetting glue or curing glue applied to oven etc. Moreover, the housing frame 2 can be adhesively disposed on the carrier substrate 10 through any type of adhesive material (not labeled) such as UV adhesive glue, thermosetting glue or curing glue applied to oven etc. In addition, the carrier substrate 10 may be a circuit substrate having a plurality of conductive pads (not labeled) disposed on the top surface of the circuit substrate, and the image sensing chip 11 has a plurality of conductive pads (not labeled) disposed on the top surface of the image sensing chip 11. Each conductive pad (not labeled) of the image sensing chip 11 can be electrically connected to the corresponding conductive pad (not labeled) of the carrier substrate 10 through a corresponding conductive wire (not labeled), thus the image sensing chip 11 can be electrically connected with the carrier substrate 10 through the conductive wires (not labeled).

Next, the step S102 is that: referring to FIG. 1 and FIG. 2, obtaining a first horizontal top surface 110 on the top side of the image sensing chip 11 by a horizontal correction system using a laser light source S. More precisely, the laser light source S is disposed at a predetermined position P (such as a fixing position) above the image sensing chip 11 to generate a first laser light beam L1 that is directly and vertically projected onto the first horizontal top surface 110 of the image sensing chip 11, and the first laser light beam L1 generated by the laser light source S is reflected by the first horizontal top surface 110 of the image sensing chip 11 to form a first reflecting light beam R1 that is directly and vertically projected onto the predetermined position P or very close to the predetermined position P. In other words, when the top side of the image sensing chip 11 is adjusted to become a first horizontal top surface 110, the first laser light beam L1 can be reflected by the first horizontal top surface 110 to form the first reflecting light beam R1 that vertically returns to the predetermined position P, or the first reflecting light beam R1 is very close to the predetermined position P due to the permissible error. At present, the top side of the image sensing chip 11 is exactly the first horizontal top surface 110 as a horizontal datum plane.

Figure 3:
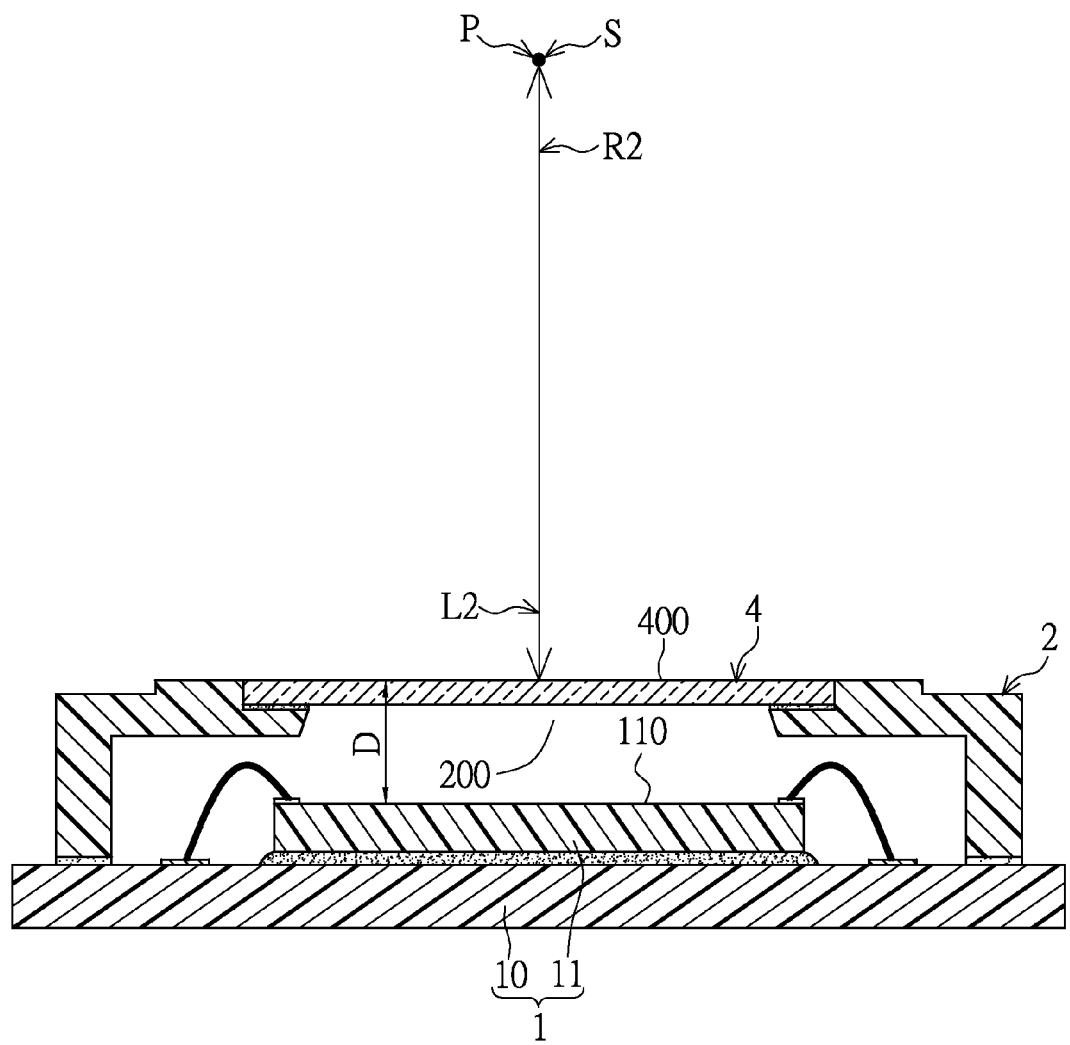
FIG. 3 shows a lateral, cross-sectional, schematic view of the assembly steps S104 and S106 of the method of assembling an image capturing module for saving focusing time and increasing assembly flatness according to the instant disclosure.

Then, the step S104 is that: referring to FIG. 1 and FIG. 3, placing an optical filter 4 on the housing frame 2 and above the image sensing chip 11. More precisely, as shown in FIG. 3, the housing frame 2 has a top opening 200 disposed on the top side thereof and right above the image sensing chip 11, and the top opening 200 of the housing frame 2 is enclosed by the optical filter 4. For example, the optical filter 4 may be a flat glass plate having an infrared (IR) coated layer and/or an antireflection (AR) coating layer, and the optical filter 4 can be fixed inside a concave space (not labeled) of the housing frame 2 through first bonding glue (not labeled) for enclosing the top opening 200 of the housing frame 2.

Afterward, the step S106 is that: referring to FIG. 1 and FIG. 3, obtaining a second horizontal top surface 400 on the top side of the optical filter 4 by the horizontal correction system using the laser light source S, wherein the distance from the second horizontal top surface 400 of the optical filter 4 to the first horizontal top surface 110 of the image sensing chip 11 is defined as a predetermined fixed focusing distance D. More precisely, the laser light source S (such as a laser level) is disposed at a predetermined position P above the optical filter 4 to generate a second laser light beam L2 that is directly and vertically projected onto the second horizontal top surface 400 of the optical filter 4, and the second laser light beam L2 generated by the laser light source S is reflected by the second horizontal top surface 400 of the optical filter 4 to form a second reflecting light beam R2 that is directly and vertically projected onto the predetermined position P or very close to the predetermined position P. In other words, when the top side of the optical filter 4 is adjusted to become a second horizontal top surface 400, the second laser light beam L2 can be reflected by the second horizontal top surface 400 to form the second reflecting light beam R2 that vertically returns to the predetermined position P, or the second reflecting light beam R2 is very close to the predetermined position P due to the permissible error. At present, the top side of the optical filter 4 can be formed as the second horizontal top surface 400 that is horizontal to the first horizontal top surface 110.

It is worth mentioning that the first laser light beam L1 generated by the laser light source S also can be inclinedly projected onto the first horizontal top surface 110 of the image sensing chip 11, and the second laser light beam L2 generated by the laser light source S also can be slantwise projected onto the second horizontal top surface 400 of the optical filter 4. When the first reflecting light beam R1 and the second reflecting light beam R2 are projected onto the same position, the top side (such as the second horizontal top surface 400) of the optical filter 4 also can be horizontal to the top side (such as the first horizontal top surface 110) of the image sensing chip 11, thus the assembly tilt angle of the movable lens assembly 31 relative to the image sensing chip 11 also can be reduced for ensuring the flatness of the movable lens assembly 31 relative to the image sensing chip 11.

Afterward, the step S108 is that: referring to FIG. 1 and FIG. 3, providing an actuator structure 3 disposed on the housing frame 2 and above the image sensing chip 11, wherein the actuator structure 3 includes a lens holder 30 disposed on the housing frame 2 and a movable lens assembly 31 disposed inside the lens holder 30 and above the image sensing chip 11, and the lens holder 30 includes a surrounding (annular) movable member 30M movably disposed therein. In addition, the movable lens assembly 31 is directly disposed on the second horizontal top surface 400 of the optical filter 4 to save the focusing time of the movable lens assembly 31 relative to the image sensing chip 11, and the first horizontal top surface 110 of the image sensing chip 11 and the second horizontal top surface 400 of the optical filter 4 are horizontal to each other for increasing the assembly flatness of the movable lens assembly 31 relative to the image sensing chip 11. Whereby, the first horizontal top surface 110 of the image sensing chip 11 and the second horizontal top surface 400 of the optical filter 4 are horizontal to each other, thus when the movable lens assembly 31 is directly disposed on the second horizontal top surface 400 of the optical filter 4, not only the assembly tilt angle of the movable lens assembly 31 relative to the image sensing chip 11 can be reduced for ensuring the flatness of the movable lens assembly 31 relative to the image sensing chip 11, but also the focusing time of the movable lens assembly 31 relative to the image sensing chip 11 can be cut down.

More precisely, the movable lens assembly 31 has a bottom plane 310 on the bottom side thereof for directly contacting the second horizontal top surface 400 of the optical filter 4, and the predetermined fixed focusing distance D from the second horizontal top surface 400 of the optical filter 4 to the first horizontal top surface 110 of the image sensing chip 11 is totally or substantially the same as an adjustable focusing distance F from the bottom plane 310 of the movable lens assembly 31 to the first horizontal top surface 110 of the image sensing chip 11.

Figure 4:
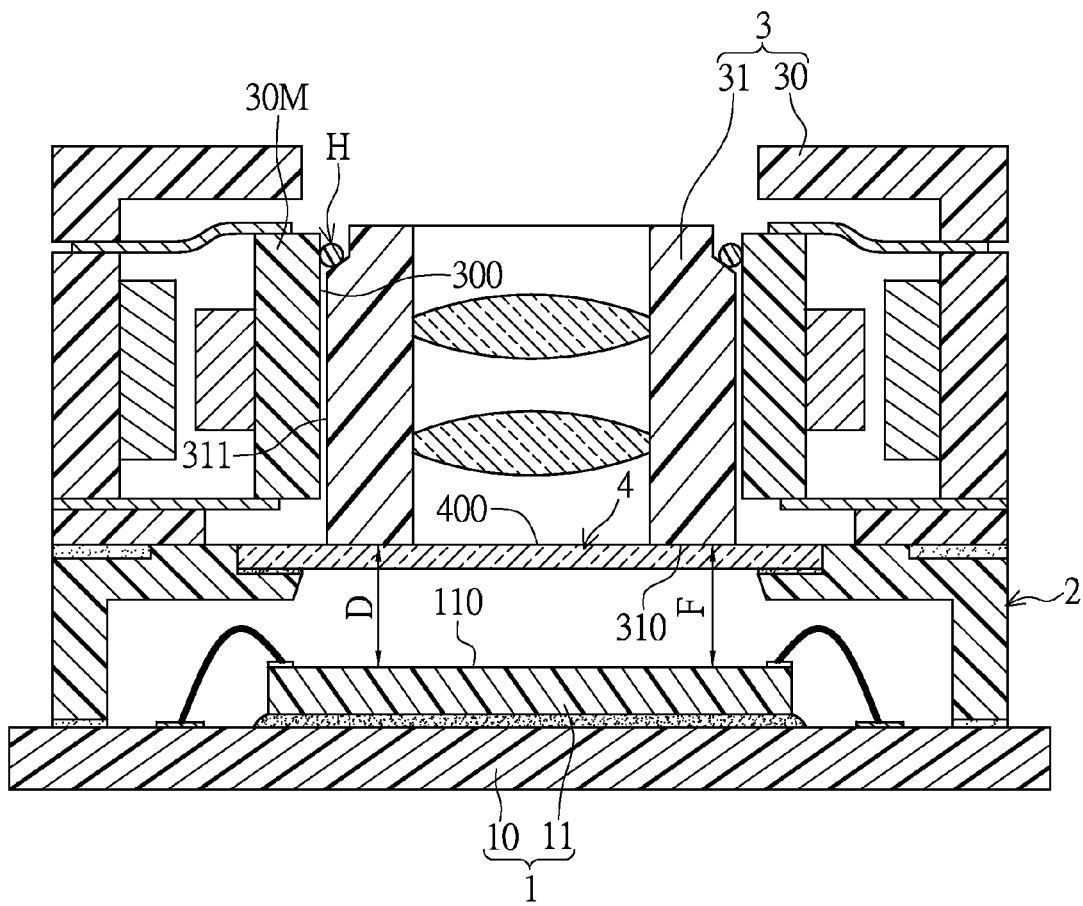
FIG. 4 shows a lateral, cross-sectional, schematic view of the assembly steps S108 and S110 of the method of assembling an image capturing module for saving focusing time and increasing assembly flatness according to the instant disclosure.

For example, the surrounding movable member 30M has an inner surrounding surface 300 such as a threadless surface, and the movable lens assembly 31 has an outer perimeter surface 311 such as a threadless surface. In addition, the lens holder 30 also can be adhesively disposed on the housing frame 2 through any type of adhesive material (not labeled) such as UV adhesive glue, thermosetting glue or curing glue applied to oven etc., and the movable lens assembly 31 may be an optical lens group that is composed of a plurality of optical lenses (not labeled). It is worth mentioning that, as shown in FIG. 4, the actuator structure 3 may be a voice coil motor actuator, but the voice coil motor actuator used in the first embodiment is merely an example and is not meant to limit the instant disclosure. For example, the actuator structure 3 can be replaced by an optical auxiliary structure having a fixed lens assembly.

Finally, the step S110 is that: referring to FIG. 1, FIG. 4 and FIG. 5, when the second horizontal top surface 400 of the optical filter 4 is horizontal to the first horizontal top surface 110 of the image sensing chip 11 and the movable lens assembly 31 is directly disposed on the second horizontal top surface 400 of the optical filter 4, fixing the movable lens assembly 31 inside the surrounding movable member 30M through at least two separate bonding glue H, wherein the movable lens assembly 31 is movably disposed inside the lens holder 30 through the surrounding movable member 30M.

Whereby, the instant disclosure provides an image capturing module M for saving focusing time and increasing assembly flatness via the assembly steps from S100 to S110, and the image capturing module M includes an image sensing unit 1, a housing frame 2, an actuator structure 3 and an optical filter 4. The image sensing chip 11 has a first horizontal top surface 110 on the top side thereof, the optical filter 4 has a second horizontal top surface 400 on the top side thereof, and the first horizontal top surface 110 and the second horizontal top surface 400 are obtained by a horizontal correction system using a laser light source S. Therefore, the first horizontal top surface 110 of the image sensing chip 11 and the second horizontal top surface 400 of the optical filter 4 are horizontal to each other, for increasing the assembly flatness of the movable lens assembly 31 relative to the image sensing chip 11. Hence, when the distance from the second horizontal top surface 400 of the optical filter 4 to the first horizontal top surface 110 of the image sensing chip 11 is defined as a predetermined fixed focusing distance D in advance, not only the movable lens assembly 31 can be directly disposed on the second horizontal top surface 400 of the optical filter 4 to cut down the focusing time of the movable lens assembly 31 relative to the image sensing chip 11, but also the first horizontal top surface 110 of the image sensing chip 11 and the second horizontal top surface 400 of the optical filter 4 can be horizontal to each other for increasing the assembly flatness of the movable lens assembly 31 relative to the image sensing chip 11.

In conclusion, the first horizontal top surface 110 on the top side of the image sensing chip 11 and the second horizontal top surface 400 on the top side of the optical filter 4 can be obtained by the horizontal correction system using the same laser light source S, thus when the second horizontal top surface 400 of the optical filter 4 is horizontal to the first horizontal top surface 110 of the image sensing chip 11, the assembly tilt angle of the movable lens assembly 31 relative to the image sensing chip 11 can be reduced for ensuring the flatness of the movable lens assembly 31 relative to the image sensing chip 11. More precisely, when the distance from the second horizontal top surface 400 of the optical filter 4 to the first horizontal top surface 110 of the image sensing chip 11 is defined as a predetermined fixed focusing distance D in advance, the movable lens assembly 31 can be directly disposed on the second horizontal top surface 400 of the optical filter 4 to cut down the focusing time of the movable lens assembly 31 relative to the image sensing chip 11.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An image capturing module for saving focusing time and increasing assembly flatness, comprising:
    an image sensing unit including a carrier substrate and an image sensing chip disposed on the carrier substrate and electrically connected to the carrier substrate, wherein the image sensing chip has a first horizontal top surface on the top side thereof, and the first horizontal top surface is obtained by a horizontal correction system using a laser light source;
    a housing frame disposed on the carrier substrate to surround the image sensing chip;
    an actuator structure disposed on the housing frame and above the image sensing chip, wherein the actuator structure includes a lens holder disposed on the housing frame and a movable lens assembly disposed inside the lens holder and above the image sensing chip, the lens holder includes a surrounding movable member movably disposed therein, the movable lens assembly is fixed inside the surrounding movable member through at least two separate bonding glue, and the movable lens assembly is movably disposed inside the lens holder through the surrounding movable member; and
    an optical filter disposed on the housing frame and between the image sensing chip and the movable lens assembly, wherein the optical filter has a second horizontal top surface on the top side thereof, and the second horizontal top surface is obtained by the horizontal correction system using the laser light source, and the distance from the second horizontal top surface of the optical filter to the first horizontal top surface of the image sensing chip is defined as a predetermined fixed focusing distance;
    wherein the movable lens assembly is directly disposed on the second horizontal top surface of the optical filter to save the focusing time of the movable lens assembly relative to the image sensing chip;
    wherein the first horizontal top surface of the image sensing chip and the second horizontal top surface of the optical filter are parallel to each other for increasing the assembly flatness of the movable lens assembly relative to the image sensing chip.

2. The image capturing module of claim 1, wherein the housing frame has a top opening disposed on the top side thereof and between the image sensing chip and the movable lens assembly, and the top opening of the housing frame is enclosed by the optical filter, wherein the movable lens assembly has a bottom plane on the bottom side thereof for directly contacting the second horizontal top surface of the optical filter, and the predetermined fixed focusing distance from the second horizontal top surface of the optical filter to the first horizontal top surface of the image sensing chip is substantially the same as an adjustable focusing distance from the bottom plane of the movable lens assembly to the first horizontal top surface of the image sensing chip, wherein the surrounding movable member has an inner surrounding surface as a threadless surface, and the movable lens assembly has an outer perimeter surface as a threadless surface.

3. The image capturing module of claim 1, wherein the laser light source is disposed at a predetermined position above the image sensing chip to generate a first laser light beam that is directly projected onto the first horizontal top surface of the image sensing chip, and the first laser light beam generated by the laser light source is reflected by the first horizontal top surface of the image sensing chip to form a first reflecting light beam that is directly projected onto the predetermined position or very close to the predetermined position.

4. The image capturing module of claim 1, wherein the laser light source is disposed at a predetermined position above the optical filter to generate a second laser light beam that is directly projected onto the second horizontal top surface of the optical filter, and the second laser light beam generated by the laser light source is reflected by the second horizontal top surface of the optical filter to form a second reflecting light beam that is directly projected onto the predetermined position or very close to the predetermined position.

5. An image capturing module for saving focusing time and increasing assembly flatness, comprising:

an image sensing unit including a carrier substrate and an image sensing chip disposed on the carrier substrate and electrically connected to the carrier substrate, wherein the image sensing chip has a first horizontal top surface on the top side thereof;

a housing frame disposed on the carrier substrate to surround the image sensing chip;

an actuator structure disposed on the housing frame and above the image sensing chip, wherein the actuator structure includes a lens holder disposed on the housing frame and a movable lens assembly movably disposed inside the lens holder and above the image sensing chip; and an optical filter disposed on the housing frame and between the image sensing chip and the movable lens assembly, wherein the optical filter has a second horizontal top surface on the top side thereof, and the distance from the second horizontal top surface of the optical filter to the first horizontal top surface of the image sensing chip is defined as a predetermined fixed focusing distance;

wherein the movable lens assembly is directly disposed on the second horizontal top surface of the optical filter to save the focusing time of the movable lens assembly relative to the image sensing chip;

wherein the first horizontal top surface of the image sensing chip and the second horizontal top surface of the optical filter are parallel to each other for increasing the assembly flatness of the movable lens assembly relative to the image sensing chip.

6. The image capturing module of claim 5, wherein the housing frame has a top opening disposed on the top side thereof and between the image sensing chip and the movable lens assembly, and the top opening of the housing frame is enclosed by the optical filter, wherein the movable lens assembly has a bottom plane on the bottom side thereof for directly contacting the second horizontal top surface of the optical filter, and the predetermined fixed focusing distance from the second horizontal top surface of the optical filter to the first horizontal top surface of the image sensing chip is substantially the same as an adjustable focusing distance from the bottom plane of the movable lens assembly to the first horizontal top surface of the image sensing chip.

7. A method of assembling an image capturing module for saving focusing time and increasing assembly flatness, comprising:

providing an image sensing unit and a housing frame, wherein the image sensing unit includes a carrier substrate and an image sensing chip disposed on the carrier substrate and electrically connected to the carrier substrate, and the housing frame is disposed on the carrier substrate to surround the image sensing chip;

obtaining a first horizontal top surface on the top side of the image sensing chip by a horizontal correction system using a laser light source;

placing an optical filter on the housing frame and above the image sensing chip;

obtaining a second horizontal top surface on the top side of the optical filter by the horizontal correction system using the laser light source, wherein the distance from the second horizontal top surface of the optical filter to the first horizontal top surface of the image sensing chip is defined as a predetermined fixed focusing distance;

providing an actuator structure disposed on the housing frame and above the image sensing chip, wherein the actuator structure includes a lens holder disposed on the housing frame and a movable lens assembly disposed inside the lens holder and above the image sensing chip, and the lens holder includes a surrounding movable member movably disposed therein, wherein the movable lens assembly is directly disposed on the second horizontal top surface of the optical filter to save the focusing time of the movable lens assembly relative to the image sensing chip, and the first horizontal top surface of the image sensing chip and the second horizontal top surface of the optical filter are horizontal to each other for increasing the assembly flatness of the movable lens assembly relative to the image sensing chip; and fixing the movable lens assembly inside the surrounding movable member through at least two separate bonding glue, wherein the movable lens assembly is movably disposed inside the lens holder through the surrounding movable member.

8. The method of claim 7, wherein the housing frame has a top opening disposed on the top side thereof and between the image sensing chip and the movable lens assembly, and the top opening of the housing frame is enclosed by the optical filter, wherein the movable lens assembly has a bottom plane on the bottom side thereof for directly contacting the second horizontal top surface of the optical filter, and the predetermined fixed focusing distance from the second horizontal top surface of the optical filter to the first horizontal top surface of the image sensing chip is substantially the same as an adjustable focusing distance from the bottom plane of the movable lens assembly to the first horizontal top surface of the image sensing chip, wherein the surrounding movable member has an inner surrounding surface as a threadless surface, and the movable lens assembly has an outer perimeter surface as a threadless surface.

9. The method of claim 7, wherein the laser light source is disposed at a predetermined position above the image sensing chip to generate a first laser light beam that is directly projected onto the first horizontal top surface of the image sensing chip, and the first laser light beam generated by the laser light source is reflected by the first horizontal top surface of the image sensing chip to form a first reflecting light beam that is directly projected onto the predetermined position or very close to the predetermined position.

10. The method of claim 7, wherein the laser light source is disposed at a predetermined position above the optical filter to generate a second laser light beam that is directly projected onto the second horizontal top surface of the optical filter, and the second laser light beam generated by the laser light source is reflected by the second horizontal top surface of the optical filter to form a second reflecting light beam that is directly projected onto the predetermined position or very close to the predetermined position.

* * * * *